United States Patent [19]

Laird et al.

[11] Patent Number: 4,631,489

[45] Date of Patent: Dec. 23, 1986

[54] FM SIGNAL MAGNITUDE QUANTIZER AND DEMODULATOR COMPATIBLE WITH DIGITAL SIGNAL PROCESSING

[75] Inventors: Kevin M. Laird, Haltom; Walt Rozanski, Hurst, both of Tex.

[73] Assignee: Motorola, Inc., Schaumburg, Ill.

[21] Appl. No.: 751,916

[22] Filed: Jul. 5, 1985

[51] Int. Cl.[4] .......................... H03D 3/00; H03D 3/24
[52] U.S. Cl. .................................... 329/110; 329/131; 375/80; 375/98
[58] Field of Search ............... 329/107, 110, 126, 131, 329/132, 133, 134, 136, 145; 375/80, 82, 94, 98

[56] References Cited

U.S. PATENT DOCUMENTS 4,375,618  3/1983  Jett, Jr. ........................... 329/136 X
4,506,228  3/1985  Kammeyer ........................ 329/107

OTHER PUBLICATIONS

"Communications Receivers of the Future", Frank P. Chiffy and Bjorn E. Bjerede, *Signal*, Nov./Dec. 1975, pp. 16-21.
IBM Technical Disclosure Bulletin, vol. 27, No. 10B, Mar. 1985, pp. 6334-6335, 375-398.

*Primary Examiner*—Eugene R. LaRoche
*Assistant Examiner*—David Mis
*Attorney, Agent, or Firm*—Donald B. Southard; Joseph T. Downey

[57] ABSTRACT

A sampled input signal is quantized to lie within a predetermined magnitude range. The quantized input signal is coupled to a bandpass filter which selects the digital signal to be processed. The bandlimited signal is then coupled to a feedback automatic gain control circuit which removes the slow variations in the envelope of the input signal. The output of the feedback AGC circuit is then coupled to a feedforward AGC circuit which removes the fast variations in the envelope of the input signal. The feedback AGC and the feed forward AGC circuits share a common envelope detector, that is composed of a squaring operation and low pass filter operation. The feedback AGC circuit also reduces the dynamic range of the input signal which is required of the feed forward AGC circuit. The processed signal is then demodulated with a quadrature FM detector. The output of the FM detector may be low pass filtered, and coupled to a D/A converter to produce an audio message signal.

3 Claims, 9 Drawing Figures

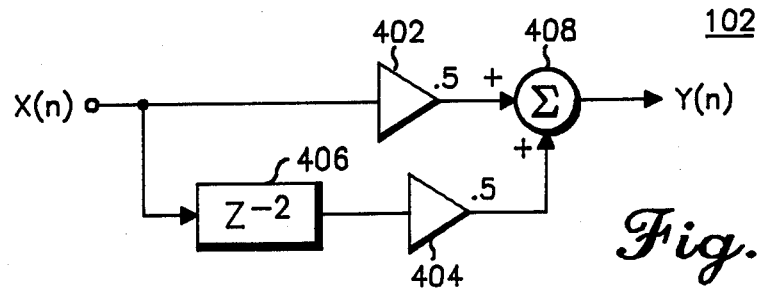
Fig. 4
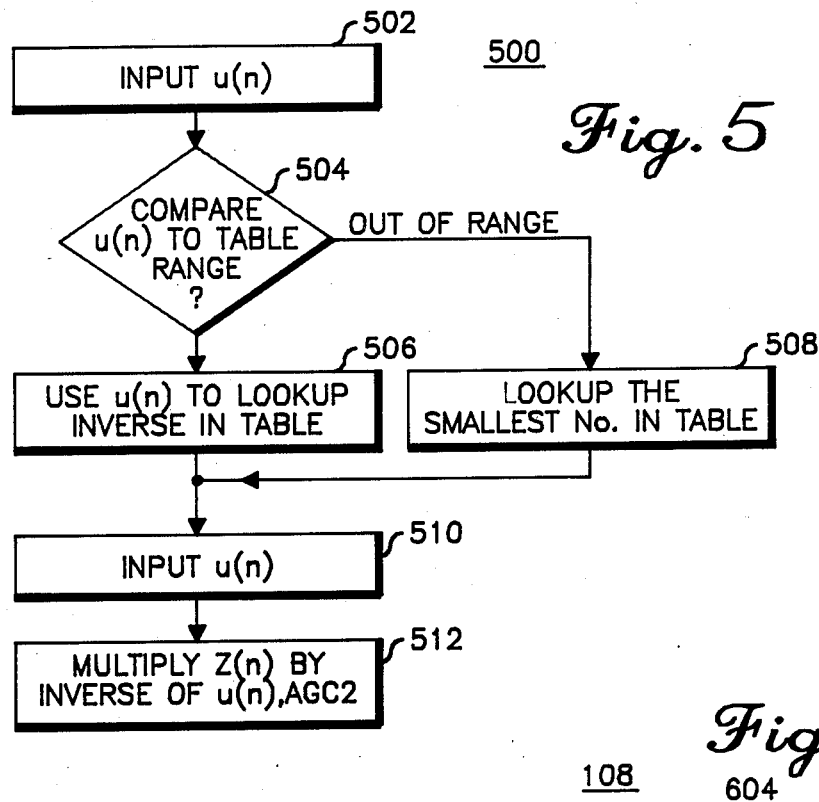
Fig. 5
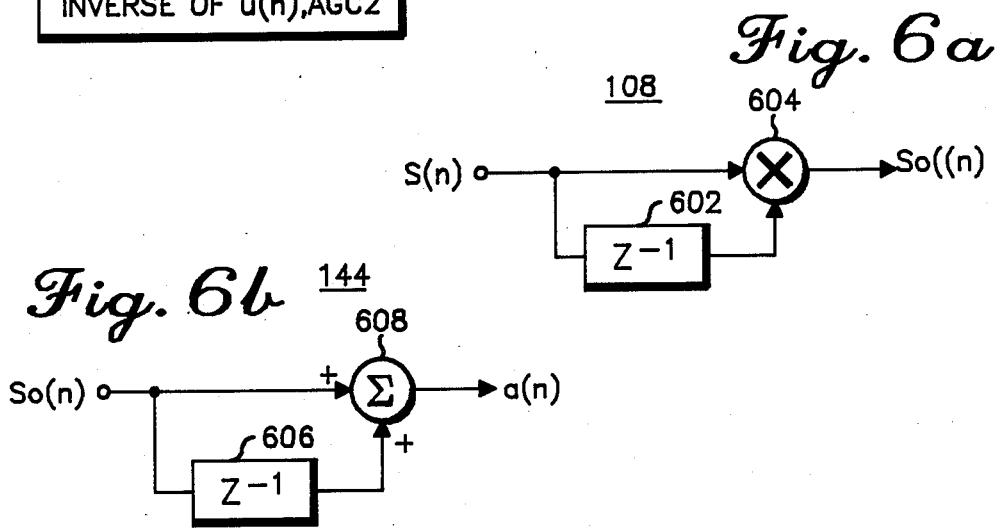
Fig. 6a
Fig. 6b

FM SIGNAL MAGNITUDE QUANTIZER AND DEMODULATOR COMPATIBLE WITH DIGITAL SIGNAL PROCESSING

FIELD OF THE INVENTION

This invention relates generally to the field of digital radio communications and specifically to an implementation of an FM demodulator which is compatible with digital signal processing techniques.

BACKGROUND OF THE INVENTION

FM demodulation is routinely performed using analog signal processing techniques. Recently, techniques have developed which allow an analog communications signal to be processed using digital signal processing techinques. These techniques include methods which may involve phase sampling and discriminating an incoming signal to recover message information. Typically, quadrature mixing is employed to recover the message information. A major problem exists with these types of digital signal processing techniques. They provide a receiver structure which inherently exhibits a narrow dynamic range. Since the processed signal exhibits a narrow operational signal dynamic range, additional processing is required to handle signals having large dynamic range, usually resulting an AGC stages added to the digital receiver structure.

Throughout the literature pertaining to the implementation of digital FM demodulators, the most common techniques cited involve either monitoring signal zero crossing, or a more conventional type of signal discrimination such as quadrature detection. Both of these approaches involve calculation of signal power, which limits the usable signal dynamic range which is processed by the FM demodulators.

These approaches have several disadvantages, some of which are the complexity and signal processing overhead required to implement the necessary gain control of the incoming signal, and the resulting narrow dynamic range of the FM detector. The characteristics of prior digital FM demodulators also produce an output signal having non-linearities introduced by the limitations of the demodulation technique.

SUMMARY AND OBJECTS OF THE INVENTION

For the foregoing problems, the present invention contemplates an improved digital FM demodulator which processes a sampled signal comprising an IF signal. According to the teachings of the present invention, the sampled input signal is quantized to lie within a predetermined magnitude range. The quantized input signal is coupled to a bandpass filter which removes unwanted components of the digital signal to be processed. The bandlimited signal is coupled to a feedback automatic gain control circuit which removes the slow variations in the envelope of the input signal. The output of the feedback AGC circuit is then coupled to a feedforward AGC circuit which removes the fast variations in the envelope of the input signal. The feedback AGC and the feedforward AGC circuits share a common envelope detector, that is composed of a squaring operation and low pass filter operation. The feedback AGC circuit also reduces the dynamic range of the input signal which is required of the feedforward AGC circuit. The processed signal is then demodulated with a quadrature FM detector. The output of the FM detector may be low pass filtered, and coupled to a D/A converter to produce an audio message signal.

Accordingly, it is an object of the present invention to provide a digital FM demodulator wherein the input frequency-to-output signal linearity is substantially ideal.

It is another object of the present invention to provide a digital FM demodulator which substantially eliminates AM to FM conversion in the demodulator output signal.

It is still another object of the present invention to provide a digital FM demodulator which provides near ideal AGC of the input signal.

It is yet another object of the present invention to implement an FM detector in a Digital Signal Processor without limiting the input signal.

These and other objects of the present invention will occur to those skilled in the art through the discussion of invention in conjunction with the Figures below.

BRIEF DESCRIPTION OF THE DRAWINGS

FIG. 4 is a schematic diagram of the bandpass filter 102 of FIG. 1.

FIG. 5 is a flow diagram detailing the the algorithm for calculating the output value for the feedforward AGC 106 of FIG. 1.

FIG. 6a is a schematic diagram detailing the configuration of the quadrature detector 108 of FIG. 1.

FIG. 6b is a schematic diagram of the low pass filter 144 of FIG. 1.

DETAILED DESCRIPTION OF THE INVENTION

Figure 1:
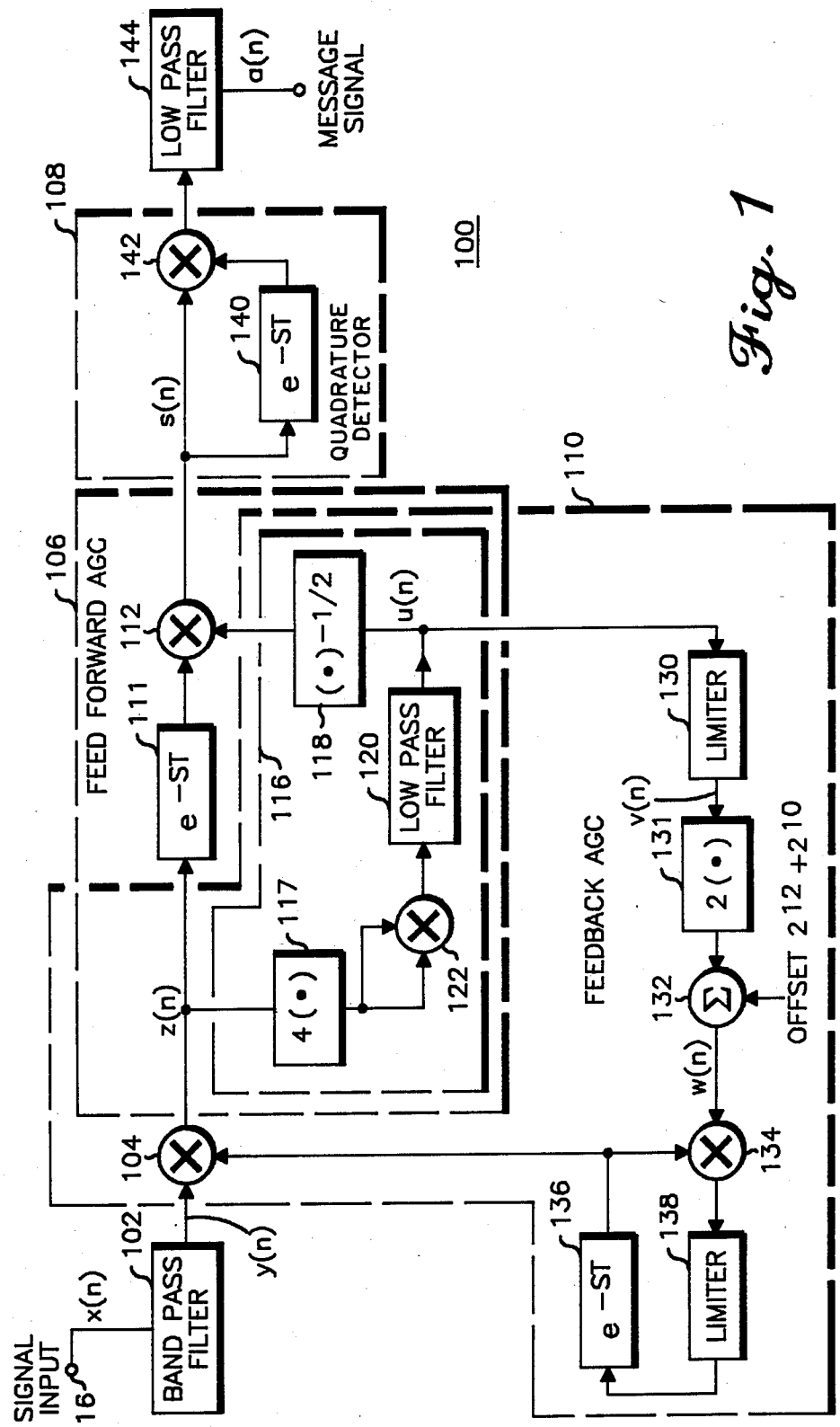
FIG. 1 is a block diagram of the digital FM demodulator of the present invention.

FIG. 1 is a block diagram of the digital FM demodulator of the present invention. According to FIG. 1, a received digitized signal is input to the FM demodulator through a bandpass filter 102. In the preferred embodiment of the present invention, the digital IF signal is characterized by a stream of 12 bit data words. The bandpass filter 102 processes the data stream to remove unwanted components of the input signal. The 12 bit output signal of bandpass filter 102 is coupled to the feedback automatic gain control (AGC) 110, where it is multiplied by the feedback AGC signal in a 16 bit digital multiplier 104. The characteristics of digital multiplier 104 will be discussed in more detail below, however, it should be noted that in addition to multiplying the input signal with the feedback AGC signal, the digital multiplier 104 also converts the input signal to a form represented by 16 bits. The output of multiplier 104 is coupled to an envelope detector 116 and to the feedforward AGC 106. The envelope detector 116 is comprised of the gain block 117, a squaring circuit 122, and a lowpass filter 120. It should be noted that the envelope detector 116 is utilized by both the feedback AGC circuit 110 and the feedforward AGC circuit 106.

In the feedback AGC circuit 110, the envelope detector 166 output is coupled to a limiter 130 having an output coupled to the digital summer 132. The limiter 130 ensures that the input to the feedback AGC never exceeds a predetermined maximum value. Another input to the digital summer 132 is coupled to an offset constant which, when summed by summer 132 with the output of limiter 130, produces a composite signal within a desired magnitude range. The offset output of summer 132 is coupled to a digital mixer 134 which generates the feedback signal by mixing the output of summer 132 with the delayed limited output of digital delay 136. The signal is limited by a limiter 138 which maintains the feedback AGC signal within a prescribed range. The one sample delay generated by the digital delay 136 produces the feedback signal in conjunction with the digital multiplier 134.

The feedforward AGC 106 performs the signal "limiting" necessary to reduce any AM to FM conversion at the output of the demodulator. The feed forward AGC is accomplished by coupling the output of the envelope detector 116 to an inverse square root device 118. The feedforward signal produced at the output of 118 represents the inverse of the root mean square signal level, which is multiplied with the output of the digital delay filter 111 by the digital multiplier 112. The digital delay filter 111 provides a delay to compensate for the delay in the lowpass filter 120. The output of the digital multiplier 112 is coupled to a quadrature detector 108.

The quadrature detector 108 performs the actual message signal recovery, although those skilled in the art will recognize that other detector circuits could be employed instead. The quadrature detector 108 is formed by a digital mixer 142 which mixes the output of the feedforward AGC 106 with the output of the digital delay 140. The digital delay 140 produces an output signal which comprises a 90° delayed version of the output of the feedforward AGC 108. The lowpass filter 144 is a digital filter which removes extraneous (sum-frequency) terms outputted by quadrature detector 108 and which removes FM noise outside the message bandwidth.

Figure 2:
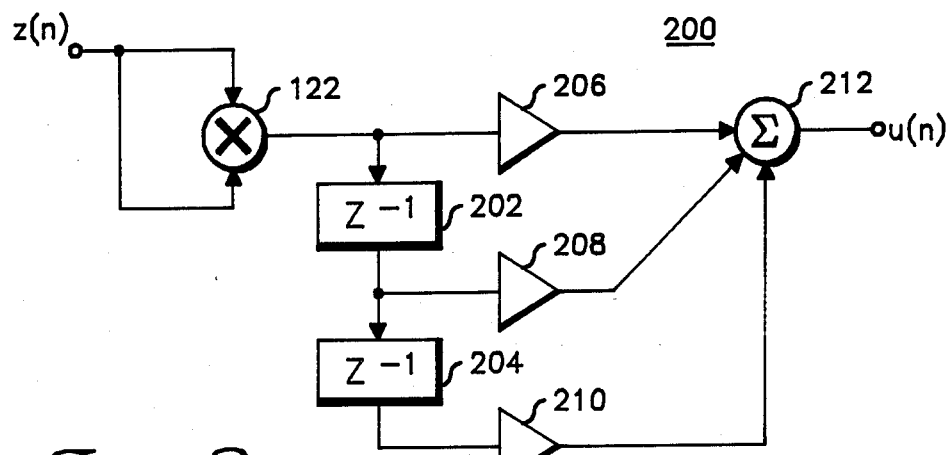
FIG. 2 is a schematic diagram detailing the implementation of the envelope detector 116 of FIG. 1.

Referring now to FIG. 2, the envelope detector portion that is common to both the feedback AGC 110 of FIGS. 1 and the feedforward AGC 106 of FIG. 1 is described and shown in detail. The input signal to the envelope detector is designated z(n). The output of the envelope detector, which comprises the square of the envelope of z(n) is designated u(n). According to the principles of the present invention, u(n) is obtained by amplifying, squaring and low pass filtering z(n). The input signal z(n) is coupled to the lowpass filter 120 (FIG. 1) through the digital multipliers 122 and 117. The digital multiplier 122 receives identical 16 bit inputs comprising the amplified z(n) and produces a 32 bit output signal. In the preferred practice of the present invention, the 16 least significant bits are discarded. The output of the squaring multiplier 122 is then processed by a finite impulse response digital filter (FIR) formed by digital delays 202 and 204 which are coupled between the inputs of constant multipliers 206, 208, and 210. The outputs of constant multipliers 206, 208, and 210 are then combined with a digital summer 212. Those skilled in the art will appreciate that the implementation of the FIR filter 120 provides a digital filter which uses a direct method of implementing a linear difference equation. A detailed discussion for this type of digital filter is contained in a text entitled *Digital Signal Processing*, A. V. Oppenheim and R. W. Schafer, Prentice Hall, 1975.

The coefficients for the constant multipliers 206, 208, and 210 are shown below in Table 1.

TABLE 1

| Constant Multiplier | Coefficient |
|---|---|
| 206 | .2509 |
| 208 | .4983 |
| 210 | .2509 |

The implementation of the digital filter of FIG. 2 provides a filter response according to the following transfer function:

$$H_2(z) = \frac{.2509 z^2 + .4983 z^2 + .2509 z}{z^2}$$

Therefore, $$u(n) = 0.2505 y(n) + 0.4983 y(n-1) + 0.2509 y(n-2)$$

The u(n) output of the envelope detector 116 is then coupled to the inverse squaring circuit 118 which produces a signal related to the inverse of the envelope of the input signal z(n). In the preferred embodiment of the present invention, the inverse squaring circuit is implemented as a ROM look-up table. The digital output of the envelope detector 116 is used to address the ROM which contains values corresponding to inverse square root of the value present at the address of the ROM. A ROM having approximately 2 K memory locations is sufficient to implement the inverse square root circuit 118.

It would be obvious to one of ordinary skill in the art that the digital demodulator could be implemented with discrete hardware digital multipliers, adders, registers, etc. However, the digital demodulator of the present invention is particularly suitable for implementation with a class of devices known as digital signal processors. The present invention would perform satisfactorily with a variety of well known digital signal processors such as Texas Instruments TMS 320 available from Texas Instruments, P.O. Box 225012, Dallas, Texas, 75265. Digital signal processors generally include hardware high speed digital multipliers as well as the ability to process a digital data stream in accordance with a predetermined algorithm. In the preferred embodiment of the present invention, signals having a relatively high data rate are processed by the RM demodulator. The data rate characteristics of the digitized IF signal of the present invention exceed the processing capabilities of a single digital signal processor, therefore the processing of the FM demodulator is shared between two digital signal processors cooperating through a common algorithm. The exact hardware configuration of the digital signal processors and the overall unifying algorithm of the present invention will be discussed in detail below in conjunction with FIGS. 7 and 8.

Figure 3:
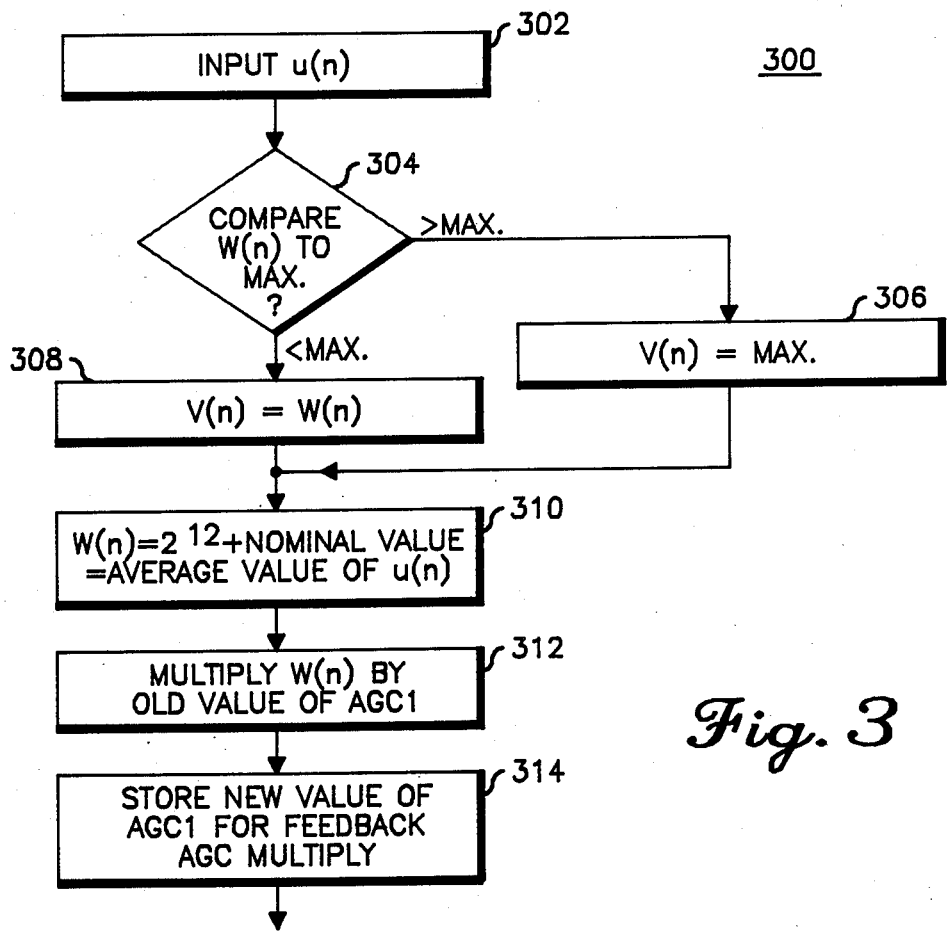
FIG. 3 is a flow diagram detailing the algorithm for calculating the output values for the feedback AGC circuit of FIG. 1.

Referring now to FIG. 3, the algorithm for calculating the output values for the feedback AGC circuit of FIG. 1 is shown in detail. The feed back AGC circuit 110 processes the u(n) output signal derived by the envelope detector 116. The feedback AGC 110 is relatively "slow" and it is intended mainly to remove envelope variations due to fading and shadowing. The feedback AGC 110 also has the benefit of reducing the dynamic range required of the feedforward AGC 106. According to FIG. 3, the feedback AGC algorithm begins with item 302 which inputs the values of u(n) produced by the envelope detector 116. The limiting operation represented by limiter 130 is performed by decision 304 in conjunction with items 306 and 308. In operation, decision 304 compares the value of u(n) input by item 302 with a predetermined maximum value. If the vaue of u(n) is less than the predetermined maximum value, item 308 is selected which outputs the current value of u(n), now designated v(n). If decision 304 determines that the current value of u(n) exceeds the predetermined maximum value, v(n) is set equal to the maximum allowed value. The current value of v(n) is then scaled and offset by item 310 to fall within a predetermined range. The scaled value of v(n), designated w(n) is determined by summing a constant value with the nominal value of u(n) and subtracting twice the current vaue of v(n). In the preferred embodiment of the present invention, the constant value is set to $2^{12}+2^{10}$. The nominal value of u(n) is equivalent to the average value of u(n), determined over several samples. The operation represented by multiplier 134 of FIG. 1 is performed by item 312 which multiplies the current value of the AGC output signal with the previous value of the AGC output signal. Item 314 then stores the new value of the AGC output signal in the Feedback AGC register for further processing. The limiter 138 of FIG. 1 operates to insure that the product of the multiply operation does not overflow the accumulator register of the digital signal processor. Therefore, it is omitted from the flow diagram since it performs primarily a mathematical check operation.

Referring now to FIG. 4, the bandpass filter 102 of FIG. 1 is shown in detail. The bandpass filter 102 is also implemented as a direct solution to the linear difference equation described above in conjunction with FIG. 2. According to FIG. 4, the bandpass filter 102 is comprised of two constant multipliers 402 and 404, a two-sample delay 406 and a digital summer 408, configured as shown in FIG. 4. The input to the bandpass filter is designated x(n) and it is obtained by sampling the receiver I.F. signal, typically 455 Khz, at a sampling rate of approximately 95.79 Khz. The input signal will then experience an "alias" at approximately 23.95 Khz. This alias signal is selected by the bandpass filter 102. The frequency response characteristic of the bandpass filter 102 is defined according to the following transfer function:

$$H_1(z) = \frac{(z-1)(z+1)}{2z^2}$$

Therefore, $$y(n) = \tfrac{1}{2}x(n) - \tfrac{1}{2}x(n-2)$$

The output y(n) of bandpass filter 102 is multiplied by the feedback AGC signal from delay filter 136 of FIG. 1 (also described in conjunction with FIG. 3) by multiplier 104 of FIG. 1. The output of the digital multiplier 104 is designated z(n) and this signal provides the input to the feedforward AGC circuit 106 of FIG. 1.

Referring now to FIG. 5, the algorithm for performing the feedforward AGC function is described in detail. The feedforward AGC function is performed by dividing the feedback AGC output signal z(n) by its envelope. Since digital signal processors cannot easily perform digital divide operations z(n) is multiplied by the inverse of the envelope, obtained by using the square of the envelope value, u(n). As mentioned above in conjunction with FIG. 1, the inverse square root values of u(n) are derived using a ROM lookup technique where the output of the envelope detector 116 is used to address the ROM (not shown). In the preferred embodiment of the present invention, the inverse square root ROM is provided with 2048 values for the inverse of u(n). The feedforward AGC 106 of FIG. 1 shows a digital delay 111 disposed in the signal path between the output of multiplier 111 and the input to multiplier 112. The delay 110 is included in the feedforward AGC to match the delay of the signal caused by the low pass filter 120 of FIG. 1. The feedforward process begins with item 502 which inputs the current value of u(n) produced by the envelope detector 116 of FIG. 2. Decision 504 then compares u(n) to a range table to determine whether the envelope value is within a predetermined range. If the current value of u(n) is out of range, decision 504 selects item 508 which selects the smallest value contained in the inverse square root ROM. If u(n) is not out of range, item 506 is selected to lookup the corresponding inverse square root value in the ROM lookup. The program proceeds to item 510 which fetches the current value of z(n). Item 512 then multiplies the current value of z(n) with the value obtained from the inverse ROM lookup corresponding to the current value of z(n), and then stores this value in the feedforward AGC output register.

Referring now to FIG. 6a, the quadrature detector 108 of FIG. 1 is shown in detail. The quadrature detector 108 comprises a one-sample delay 602 and a digital mixer 604 coupled as shown in FIG. 6a. An FM quadrature detector is characterized according to the following relationship:

$$S_O(t) = S(t) \cdot S_D(t)$$

$$S_O(t) = \text{output}$$

$$S_D(t) = S(t) \text{ delayed by } 90° \text{ in time}$$

The sampling frequencies of the present invention are chosen such that one sample time is equivalent to 90° of the input frequency. Therefore, a 90° phase shift is provided by the one sample digital delay 602. When the output of the digital delay 602 is combined with the s(n) output of the feedforward AGC 106, with the digital multiplier 604, the quadrature detector 108 produces an output in accordance with the equation set forth above.

The output of the quadrature detector 108 is then processed by the lowpass filter 144 of FIG. 6b. The low pass filter 144 comprises a one-sample digital delay 606 and a digital summer 608 coupled as shown in FIG. 6b. The low pass filter 144 operates on the same principle as the digital filters described above and provides a response defined according to the following transfer function:

$$H_3(z) = z + 1/z$$

Therefore, $$a(n) = S_O(n) + S_O(n-1)$$

The a(n) output of low pass filter 144 corresponds to the demodulated message signal.

Figure 7:
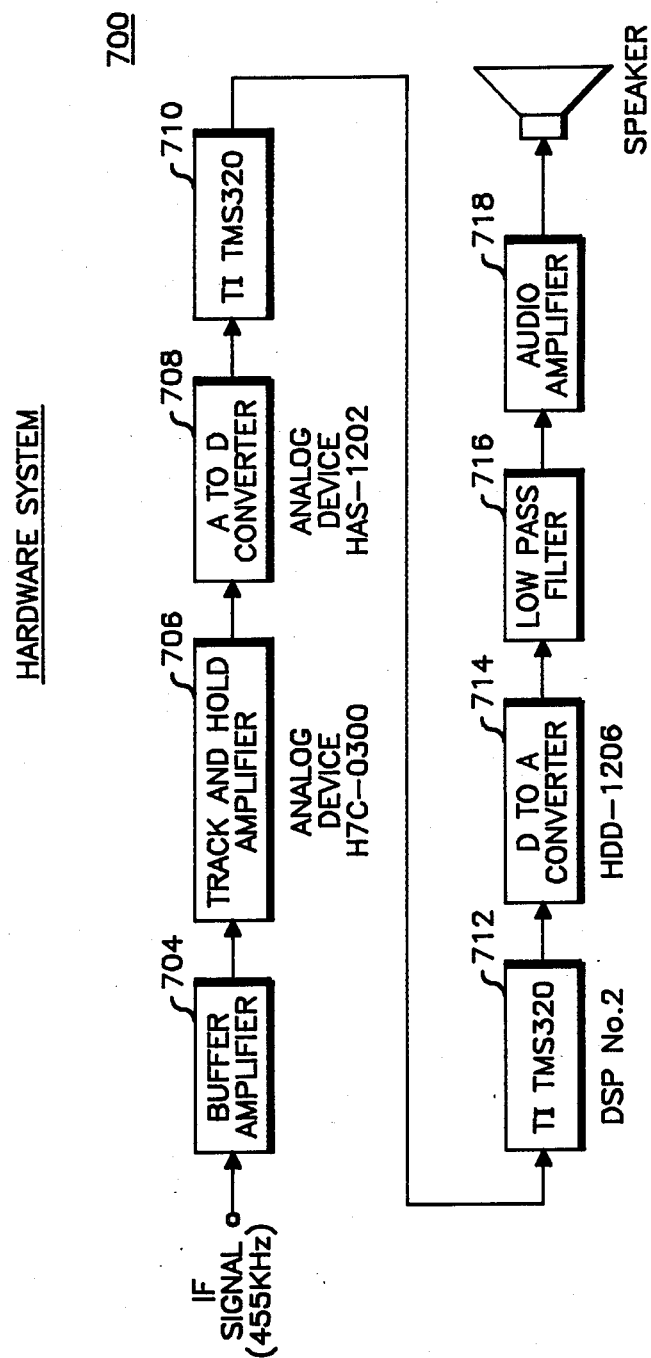
FIG. 7 is a schematic and block diagram of an implementation of the FM demodulator of the present invention employing Digital Signal Processors.

Referring now to FIG. 7, a hardware system suitable for implementing the FM demodulator of the present invention is shown in block diagram form. As mentioned above, current digital signal processors are not capable of processing information fast enough to implement an FM demodulator in real time. Therefore, the FM demodulator of the present invention is implemented on two separate digital signal processors which share the processing task. Specifically, digital signal processor 710 performs the feedback AGC function and digital signal processor 712 performs the feedforward AGC, the FM quadrature detection and the low pass filtering after detection.

The input to the hardware system of the present invention is comprised of the buffer amplifier 704 which is coupled to the 455 Khz IF signal. The output of Buffer amplifier 704 is then coupled to a sample and hold amplifier 706 which samples the input signal. The sample and hold amplifier 706 may be of the type designated H7C-0880, available from Analog Devices Inc., One Technology Way, P.O. Box 280, Norwood, MA, 02062. The output of the sample and hold amplifier 706 is coupled to an A/D converter circuit 708 which converts to a quantized signal in a digital form represented by 12 binary bits. The A/D converter may be of the type designated HAS-1202, also available from Analog Devices Inc. Those skilled in the art will appreciate that the output of the A/D converter, and the remainder of the FM demodulator comprises a multi-bit data signal, and several clock signals and power connections are not shown in FIG. 7. The exact requirements of these circuits may be easily ascertained from the data manuals corresponding to the particular circuits. The multi-bit output of the A/D converter 708 is then coupled to the input of a first digital signal processor 710 which cooperates with a second identical digital signal processor 712. The digital signal processors may be of a type designated TMS 320 available from Texas Instruments, Inc. P.O. Box 225012, Dallas, Tex., 75265. The operation of digital signal processors 710 and 712 will be described in more detail in conjunction with FIG. 8. The output of the digital signal processor 712 comprises the demodulated message signal which is converted to an analog form by the D/A converter 714. After filtering by low pass filter and audio shaping 716, the message signal may be amplified by the amplifier 718 and output through a speaker 720.

Figure 8:
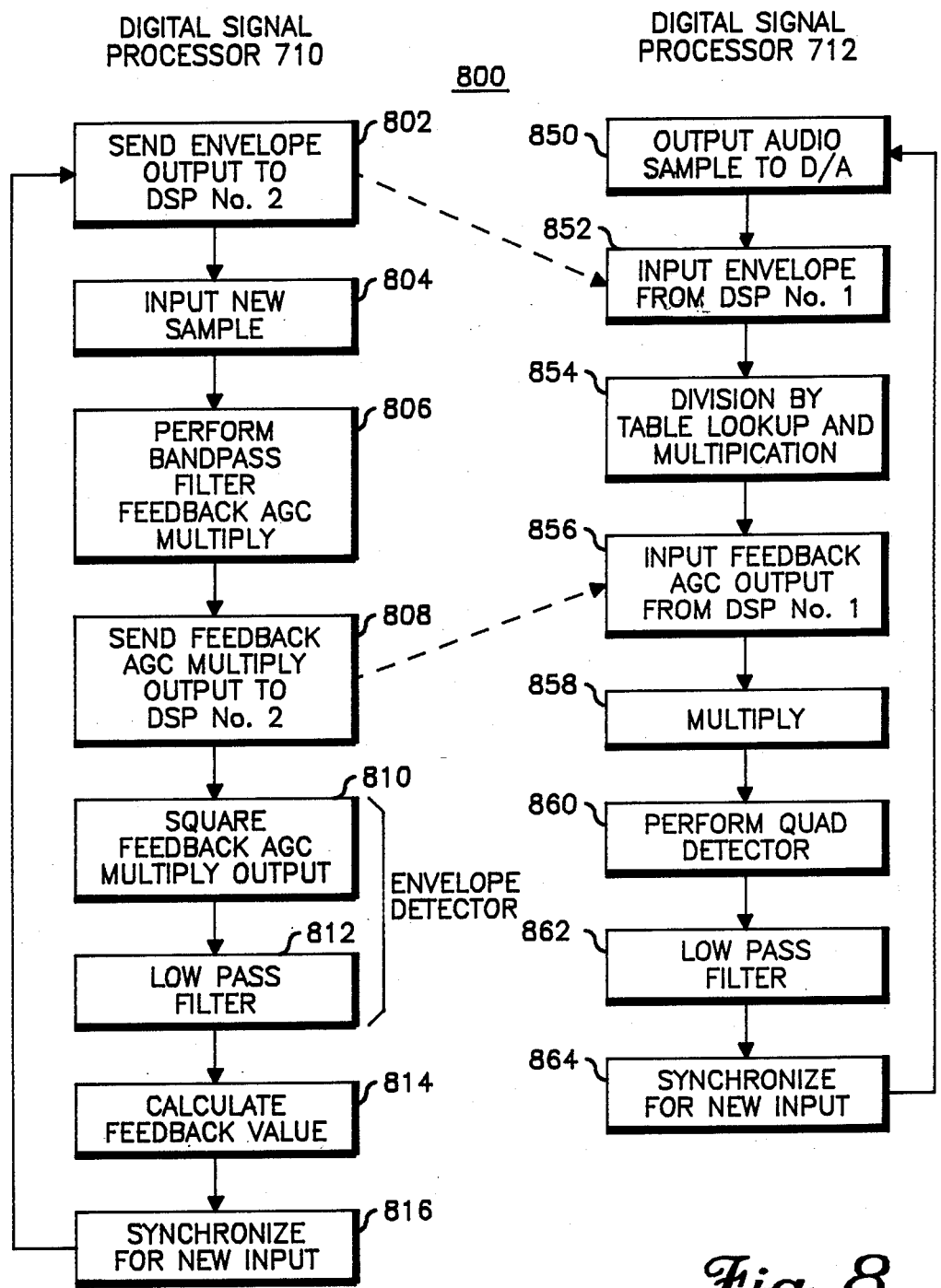
FIG. 8 is a flow diagram detailing the overall operation of the digital signal processing circuits of FIG. 7.

Referring now to FIG. 8, there is a flow diagram detailing the overall operation of the digital signal processing circuits of FIG. 7. The operation of digital signal processor 710 of FIG. 7 is characterized by items 802 through 816. The operation of digital signal processor 712 is characterized by items 850 through 862. As indicated in FIG. 8, the operation of digital signal processor 712 utilizes several values which are derived by digital signal processor 710. According to FIG. 8, digital signal processor 710 sends a value corresponding to the envelope of the input signal to item 852 once every cycle at item 802 for processing by digital signal processor 712 at item 852. The digital signal processor 710 then performs item 804 to select a new input sample, and item 806 then performs the bandpass filter and feedback AGC multiply operations detailed in conjunction with FIG. 3. Item 808 then sends the result of this operation to item 856 for processing by digital signal processor 712. Items 810 and 812 then process the envelope detector function which was detailed in conjunction with FIG. 2. The feedback AGC value is then calculated by item 814 in accordance with the algorithm described in detail in conjunction with FIG. 3. Item 816 then synchronizes the digital signal processor 710 for the next processing cycle before selecting item 802 to restart the process.

The operation of digital signal processor 712 is described by items 850 through 862. Once every sampling clock cycle, a sample is output to the D/A converter 714 of FIG. 7 by item 850. Item 852 is then selected to input the envelope sample output by item 802. This sample is used by item 854 to determine the inverse ROM lookup value as detailed in FIG. 5. Item 856 is then selected to fetch the feedback AGC output value z(n) produced and output by item 808. Item 858 then multiplies the inverse ROM lookup value determined by item 854 by the value of the feedback AGC output which was fetched by item 856. Since z(n) is taken into the digital signal processor 712 after the feedforward multiply operation, and is not used until the next cycle, the delay 110 of FIG. 1 is inherent in the processing scheme. Item 860 then performs the quad detector function detailed in conjunction with 6a and item 862 performs the low pass filter function detailed in conjunction with FIG. 6b. Item 864 then synchronizes the digital signal processor 712 for a new input cycle before selecting item 850 to repeat the processing cycle.

In summary, a digital FM demodulator has been described. According to the principles of the present invention, a digital FM signal is demodulated by a digital FM demodulator which processes a sampled signal comprising an IF signal. According to the teachings of the present invention, the sampled input signal is quantized to lie within a predetermined magnitude range. The quantized input signal is coupled to a bandpass filter which selects the digital signal to be processed. The bandlimited signal is then coupled to a feedforward automatic gain control circuit which processes the envelope of the digital signal by squaring and lowpass filtering the output of a feedback AGC circuit to remove the fast variations of the input signal. A feedback AGC circuit is disposed between the lowpass filter output of the squaring portion of the feedforward AGC circuit and the input mixer circuit. The feedback AGC circuit acts to remove slow variations in the envelope of the input signal. The feedback AGC circuit also reduces the dynamic range of the input signal which is required by the feedback AGC. The processed signal is then demodulated with a quadrature FM detector. The output of the FM detector may then be low pass filtered, and coupled to a D/A converter to produce an audio message signal. Accordingly, other uses and modifications of the present invention will be obvious to one of ordinary skill in the art without departing from the spirit and scope of the principles of the present invention.

We claim:

1. An improved FM demodulator circuit for recovering and demodulating a FM signal in a received carrier signal, which demodulator circuit is compatible with digital signal processing and effective in maintaining a relatively constant envelope at the input to the associated FM detector, said demodulator circuit comprising:
   (a) means including bandpass filter means for selecting a desired band of IF frequencies;
   (b) feedback AGC means, including multiplier means coupled to the output of said bandpass filter means, and an AGC input and output, said feedback AGC means removing slow envelope variations of the FM IF signal; and (c) feedforward AGC means, coupled to said output of said feedback AGC means, for eliminating fast amplitude modulation variations present on the FM IF signal, said feedforward AGC means further having a first output comprising the recovered FM signal and a second output coupled to said AGC input of said feedback AGC means, said second output comprising the square of the envelope of the recovered FM signal; and (d) FM detector means coupled to said first output of said feedforward AGC means for recovering a baseband signal.

2. The FM demodulator circuit of claim 1 further including:

(f) digital low pass filter means, coupled to said FM detector means, for removing a double frequency term.

3. The FM demodulator circuit of claim 2 further including:

(g) Digital-to-Analog converter means coupled to said digital low pass filter means for producing an analog message signal.

* * * * *

UNITED STATES PATENT AND TRADEMARK OFFICE
CERTIFICATE OF CORRECTION

PATENT NO. : 4,631,489

DATED : December 23, 1986

INVENTOR(S) : Kevin M. Laird, et al.

It is certified that error appears in the above-identified patent and that said Letters Patent is hereby corrected as shown below:

In Column 1, line 27, change "an" to -- in --.

In Column 3, line 4, change "166" to -- 116 --.

Signed and Sealed this

Twenty-second Day of September, 1987

*Attest:*

DONALD J. QUIGG

*Attesting Officer*   *Commissioner of Patents and Trademarks*